United States Patent
Sato et al.

(10) Patent No.: US 6,211,585 B1
(45) Date of Patent: Apr. 3, 2001

(54) STEPPING MOTOR TYPE INDICATOR HAVING A POLE TOOTH WITH REDUCED END AREA

(75) Inventors: Hitoshi Sato; Koichi Sato; Hiroyasu Numaya; Hiroyuki Matsuda; Masaru Iwahashi; Keiji Tsurumaki; Koichi Jinushi, all of Nagaoka (JP)

(73) Assignee: Nippon Seiki Co., Ltd., Niigata (JP)

( * ) Notice: Subject to any disclaimer, the term of this patent is extended or adjusted under 35 U.S.C. 154(b) by 0 days.

(21) Appl. No.: 09/285,722

(22) Filed: Apr. 5, 1999

(30) Foreign Application Priority Data

Apr. 28, 1998 (JP) .................................. 10-117680

(51) Int. Cl.[7] ................. H02K 1/12; H02K 1/22
(52) U.S. Cl. ............... 310/49 R; 310/261; 310/263; 310/254; 310/257; 310/258; 310/259
(58) Field of Search ................. 310/49 R, 261, 310/263, 254, 257, 258, 259; 324/154 R, 146

(56) References Cited

U.S. PATENT DOCUMENTS 5,598,046 * 1/1997 Miyazawa et al. ............ 310/49 R
5,877,694 * 3/1999 Kataoka ...................... 340/688

FOREIGN PATENT DOCUMENTS

| 196 10 059 | 9/1996 | (DE) . |
| 0 756 175 | 1/1997 | (EP) . |
| 6-078513 | 3/1994 | (JP) . |
| 6-153484 | 5/1994 | (JP) . |
| 9-184740 | 7/1997 | (JP) . |

* cited by examiner

*Primary Examiner*—Nestor Ramirez
*Assistant Examiner*—Guillermo Perez
(74) *Attorney, Agent, or Firm*—McDermott, Will & Emery

(57) ABSTRACT

A stepping motor type indicator provided with unambiguous stable points having a holding force in a non-excited condition sufficient to suppress undesirable movements of a pointer. The stepping motor type indicator includes a stepping motor (2) having a rotor (28) with an output shaft (27) and stators (A, B). Yokes (23, 26) have a plurality of pole teeth (232, 233, 262, 263) extending toward curved outer surfaces of the rotor. The pole ends of a specific pole tooth (232a) chosen from one of the plurality of pole teeth is made to have a pole end area different than that of the remaining pole teeth. This structure produces unambiguous stable points ("a"–"l") and produces strong holding forces so that an attractive force exerted by the stable point ("a") on the pointer (4) toward stopper pin (7) is increased to positively suppress undesirable movements of pointer (4).

5 Claims, 7 Drawing Sheets waveform of the driving (voltage) signal fed into the first exciting coil waveform of the driving (voltage) signal fed into the second exciting coil

STEPPING MOTOR TYPE INDICATOR HAVING A POLE TOOTH WITH REDUCED END AREA

BACKGROUND OF THE INVENTION

1. Field of the Invention

The present invention relates to stepping motor type indicators for indicating various types of varying measurements, such as the running speed or engine speed of a vehicle, by the pointing direction or angle of a pointer which swings over a dial. More particularly, the invention pertains to a structure for supporting the pointer.

2. Description of the Related Art

A PM type stepping motor is a device widely used as an actuator in conventional office automation equipment, home electronic appliances and motor vehicles, for instance. The PM-type stepping motor allows easy control of forward and reverse running operation and its physical size can be easily reduced depending on required driving torque. For this reason, the PM-type stepping motor attracts growing attention in recent years as a prime mover for instruments as a substitute for air-core type movements of cross coil instruments.

As disclosed in JP-A-6-153484, for instance, a stepping motor of this type mostly comprises a rotor having an output shaft and constructed essentially of a permanent magnet and a stator formed of a yoke having an array of pole teeth arranged face to face with a curved outer surface of the rotor and exciting coils for magnetizing the pole teeth, wherein driving signals having controlled phase differences are fed into the individual exciting coils of the stator to magnetize the pole teeth and thereby produce a rotating magnetic field, which causes the rotor to rotate.

With a pointer fixed to the output shaft and a dial plate fixed between the pointer and the stepping motor, the driving signals fed into the exciting coils are controlled in accordance with a measurement value (e.g., the varying running speed or engine speed of a vehicle), whereby the motor can be used as a prime mover of an indicator.

In a case where the stepping motor is used as a prime mover of an indicator as described above, it is necessary to hold the pointer stationary at a specified position over the dial plate and suppress undesirable movements of the pointer during a period when no driving voltage signals are applied to the exciting coils. An effective means for achieving this is rotor (pointer) arresting means which mechanically stops pointer movements.

In the stepping motor, however, complicated magnetic circuits are formed between the rotor and the stator including the pole tooth array and the magnetic circuits produce magnetic forces which act on the rotor even under a non-excited condition, although the magnetic forces are considerably small. Therefore, with the provision of the rotor arresting means alone, the pointer is apt to depart from the position where it was set by the rotor arresting means. In this circumstance, there has been the need for an effective means of positively holding the pointer at a specified position.

Taking into consideration the aforementioned problem of the prior art, the applicants of the present invention previously proposed in JP-A-9-184740 an arrangement for holding a pointer at a specified position by using magnetic forces exerted on a rotor under the non-excited condition. This previous arrangement was devised in the light of the fact that the magnetic forces exerted by a yoke on the rotor under the non-excited condition produce a plurality of stable points which attract and hold the pointer (rotor). More specifically, a stopping position of the pointer determined by rotor arresting means is set at a point located on a decreasing side of a middle point between two adjacent stable points existing along increasing and decreasing directions of the pointer in the previous arrangement.

However, the strength of holding forces of such stable points could differ from one product to another due to assembly errors or dimensional errors of constituent components, or the stable points which could force or attract the rotor to specific positions might not be positively formed in certain cases. Even when a stopping position of the pointer is set in consideration of the location of the stable points as described above, it might not be possible to positively hold the pointer at the set stopping position if the stable points formed are ambiguous and the holding forces of the stable points are too small. It is understood from the above discussion that there are limitations in the aforementioned previous arrangement as the means of holding the pointer at a specified position under non-excited conditions and, therefore, there has been a continuing need for improvement.

It is an object of the invention to provide a stepping motor type indicator whose stepping motor forms unambiguous stable points which produce a sufficiently strong holding force in a non-excited condition, making it possible to suppress undesirable movements of a pointer.

BRIEF SUMMARY OF THE INVENTION

To achieve this object, a stepping motor type indicator in one aspect of the invention comprises a stepping motor which is constructed of a rotor formed of permanent magnets and having an output shaft, and a stator having a yoke, from which a plurality of pole teeth extend toward a curved outer surface of the rotor, and an exciting coil for magnetizing the yoke, in which the rotor is driven to rotate in accordance with a measurement value, a pointer which is connected to the output shaft of said stepping motor and indicates the measurement value on a dial plate, and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yoke in a non-excited condition of the exciting coil, and the pole end area of a specific pole tooth chosen from said multiple pole teeth facing the rotor is made different from the pole end areas of the other pole teeth facing the rotor.

In another aspect of the invention, a stepping motor type indicator comprises a stepping motor which is constructed of a rotor formed of permanent magnets and having an output shaft, and first and second stators individually having yokes, from which a plurality of pole teeth extend toward a curved outer surface of the rotor, and exciting coils for magnetizing the yokes, in which said first and second stators are concentrically stacked and said rotor is driven to rotate in accordance with a measurement value, a driver which supplies driving signals to the exciting coils of said individual stators to cause the rotor to rotate in accordance with the measurement value, a pointer which is connected to the output shaft of said stepping motor and indicates the measurement value on a dial plate, and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yokes in a non-excited condition of the exciting coils, the pole end area of a specific pole tooth chosen from said multiple pole teeth facing the rotor is made different from the pole end areas of the other pole teeth facing the rotor so that a relative difference is created between the pole end areas of the pole teeth of said first stator facing the rotor and those of the pole teeth of said second stator, and the root-mean-square value of the driving signal fed into the exciting coil of said first stator whose pole teeth have smaller pole end areas facing the rotor is made higher than the root-mean-square value of the driving signal fed into the exciting coil of said second stator whose pole teeth have larger pole end areas facing the rotor.

In one specific form of the invention, the pole end area of only one specific pole tooth is made different from the pole end areas of the other pole teeth.

In a further aspect of the invention, a stepping motor type indicator comprises a stepping motor which is constructed of a rotor formed of permanent magnets and having an output shaft, and first and second stators individually having yokes, from which a plurality of pole teeth extend toward a curved outer surface of the rotor, and exciting coils for magnetizing the yokes, in which said first and second stators are concentrically stacked and said rotor is driven to rotate in accordance with a measurement value, a driver which supplies driving signals whose output waveforms have a phase difference of about 90< in terms of electrical angle to the exciting coils of said individual stators to cause the rotor to rotate in accordance with the measurement value, a pointer which is connected to the output shaft of said stepping motor and indicates the measurement value on a dial plate, and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yokes in a non-excited condition of the exciting coils, the pole end area of a specific pole tooth chosen from said multiple pole teeth facing the rotor is made different from the pole end areas of the other pole teeth facing the rotor, and an angular position taken by the said pointer when said driver outputs the driving signals corresponding to an electrical angle of 0° and said stable point in the non-excited condition are matched exactly or approximately with each other.

DETAILED DESCRIPTION OF THE INVENTION

Figure 1:
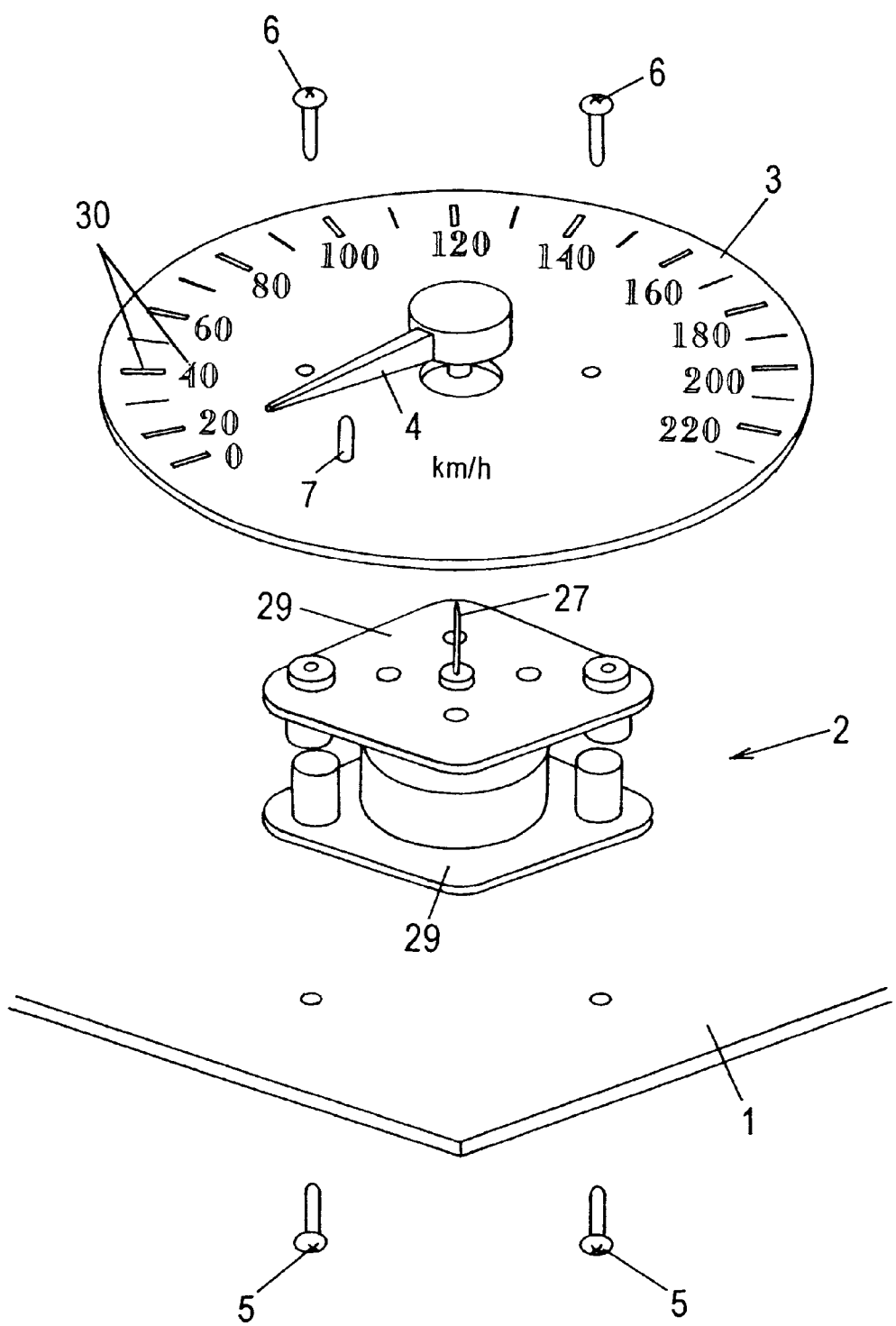
FIG. 1 is an exploded perspective view of a stepping motor type indicator according to a preferred embodiment of the invention.

According to the invention, a stepping motor type indicator comprises a stepping motor 2 which is constructed of a rotor 28 having an output shaft 27 and first and second stators A, B having yokes 23, 26, from which a plurality of pole teeth 232, 233, 262, 263 extend toward a curved outer surface of the rotor 28, and exciting coils 21, 24 for magnetizing the yokes 23, 26, respectively, wherein the rotor 28 is driven to rotate in accordance with a measurement value, a pointer 4 which is connected to the output shaft 27 of the stepping motor 2 and indicates the measurement value on a dial plate 3, and a stopper pin (rotor arresting means) 7 for stopping the pointer 4 at a specified stopping position P on the dial plate 3. When the exciting coils 21, 24 are not excited, there are formed a plurality of stable points a–l of the rotor 28 along the turning direction of the pointer 4 due to magnetic forces exerted between the rotor 28 and the yokes 23, 26. The stopping position P of the rotor 28 (pointer 4) determined by the stopper pin 7 is set at a point closer to the stable point a which is located on a decreasing side of dial reading than an approximately middle point M between arbitrarily selected two adjacent stable points (a and b in this example). Since the pole end area of a specific pole tooth 232a chosen from the multiple pole teeth 232, 233, 262, 263 facing the rotor 28 is made different from the pole end areas of the other pole teeth 232, 233, 262, 263 facing the rotor 28 in this construction, the individual stable points a–l become unambiguous and produce strong holding forces so that an attracting force exerted by the stable point a on the pointer 4 (rotor 28) toward the stopper pin 7 is increased, making it possible to positively suppress undesirable movements of the pointer 4.

In a case where the individual pole teeth 232, 233, 262, 263 have the same pole end area, it is unlikely that large differences occur in detent torques produced by magnetic circuits formed between individual magnetic poles of the rotor 28 and their corresponding pole teeth 232, 233, 262, 263 and, therefore, the detent torques are generally balanced around the curved outer surface of the rotor 28. In the aforementioned construction, however, there is made a distinct difference between the detent torque produced by the pole tooth 232a whose pole end area differs and the detent torques produced by the other pole teeth 232, 233, 262, 263. Such variations in the detent torque create highly distinguishable relative differences between unstable points M (which exert smaller attracting forces on the rotor 28) and the stable points a–l (which exert larger attracting forces on the rotor 28) which are formed at specific intervals along the rotating direction of the rotor 28. For this reason, the stable points a–l become more distinct and, as a consequence, the attracting force exerted on the pointer 4 (rotor 28) by the stable point a toward the stopper pin 7 is increased and undesirable movements of the pointer 4 can be positively suppressed.

As the pole end area of the specific pole tooth 232a chosen from the multiple pole teeth 232, 233, 262, 263 facing the rotor 28 is made different from the pole end areas of the other pole teeth 232, 233, 262, 263 as described above, there is created a relative difference between the pole end areas of the pole teeth 232 (232a), 233 of the first stator A facing the rotor 28 and those of the pole teeth 262, 263 of the second stator B. Since the root-mean-square value of a driving signal fed from driving means 800 into the exciting coil 21 of the first stator A whose pole teeth 232 (232a), 233 have smaller pole end areas facing the rotor 28 is made higher than the root-mean-square value of a driving signal fed into the exciting coil 24 of the second stator B whose pole teeth 262, 263 have larger pole end areas facing the rotor 28, it becomes possible to maintain good excitation balance between the individual stators A, B in a normal driven condition (excited condition) and thereby suppress such adverse effects on rotary motion of the rotor 28 as an increase in the indication error of the pointer 4 and degradation of smoothness of the movement of the pointer 4.

When the pole end area of the specific pole tooth 232a facing the rotor 28 is made different from the pole end areas of the other pole teeth 232, 233, 262, 263 and there is a relative difference between the pole end areas of the pole teeth 232 (232a), 233 of the first stator A facing the rotor 28 and those of the pole teeth 262, 263 of the second stator B, a difference in excitation torque could occur between the two stators A, B in a normal operating condition (excited condition), affecting rotational characteristics of the rotor 28 (pointer 4) in certain cases. In the aforementioned construction, because the root-mean-square value of the driving signal fed into the exciting coil 21 of the first stator A whose pole teeth 232 (232a), 233 have smaller pole end areas facing the rotor 28 is made higher than the root-mean-square value of the driving signal fed into the exciting coil 24 of the second stator B whose pole teeth 262, 263 have larger pole end areas facing the rotor 28, the excitation torque produced by the first stator A is increased relative to the excitation torque produced by the second stator B to thereby achieve a proper balance of excitation torque between the two stators A, B. This makes it possible to suppress such adverse effects on the rotational characteristics of the rotor 28 as an increase in the indication error of the pointer 4 and degradation of smoothness of the movement of the pointer 4.

In addition, because the pole end area of only one specific pole tooth 232a is made different from the pole end areas of the other pole teeth 232, 233, 262, 263, adverse effects on the rotational characteristics of the rotor 28 in the normal operating condition (excited condition) can be reduced.

More specifically, although the rotational characteristics of the rotor 28 (pointer 4) in the normal operating condition (excited condition) would be affected if the pole end areas of some of the pole teeth 232, 233, 262, 263 are differentiated from the pole end areas of the other pole teeth 232, 233, 262, 263, such adverse effects on the rotational characteristics of the rotor 28 during operation in the excited condition as an increase in the indication error of the pointer 4 and degradation of smoothness of the movement of the pointer 4 can be minimized when the pole end area of only one pole tooth 232a is made different from the pole end areas of the other pole teeth 232, 233, 262, 263.

In a case where the driving means 800 for driving the stepping motor 2 supplies the driving signals whose output waveforms have a phase difference of about 90° in terms of electrical angle, it is possible to prevent the pointer 4 from moving from its stopping position P determined by the stopper pin 7 when the driving means 800 outputs the driving signals corresponding to an electrical angle of 0° (when an ignition switch 84 is turned on, for example), if an angular position taken by the pointer 4 when the driving means 800 outputs the driving signals corresponding to the electrical angle of 0° and the stable point a produced in the non-excited condition are matched exactly or approximately with each other.

A stepping motor type indicator according to a preferred embodiment of the invention is now described referring to the accompanying drawings.

Figure 2:
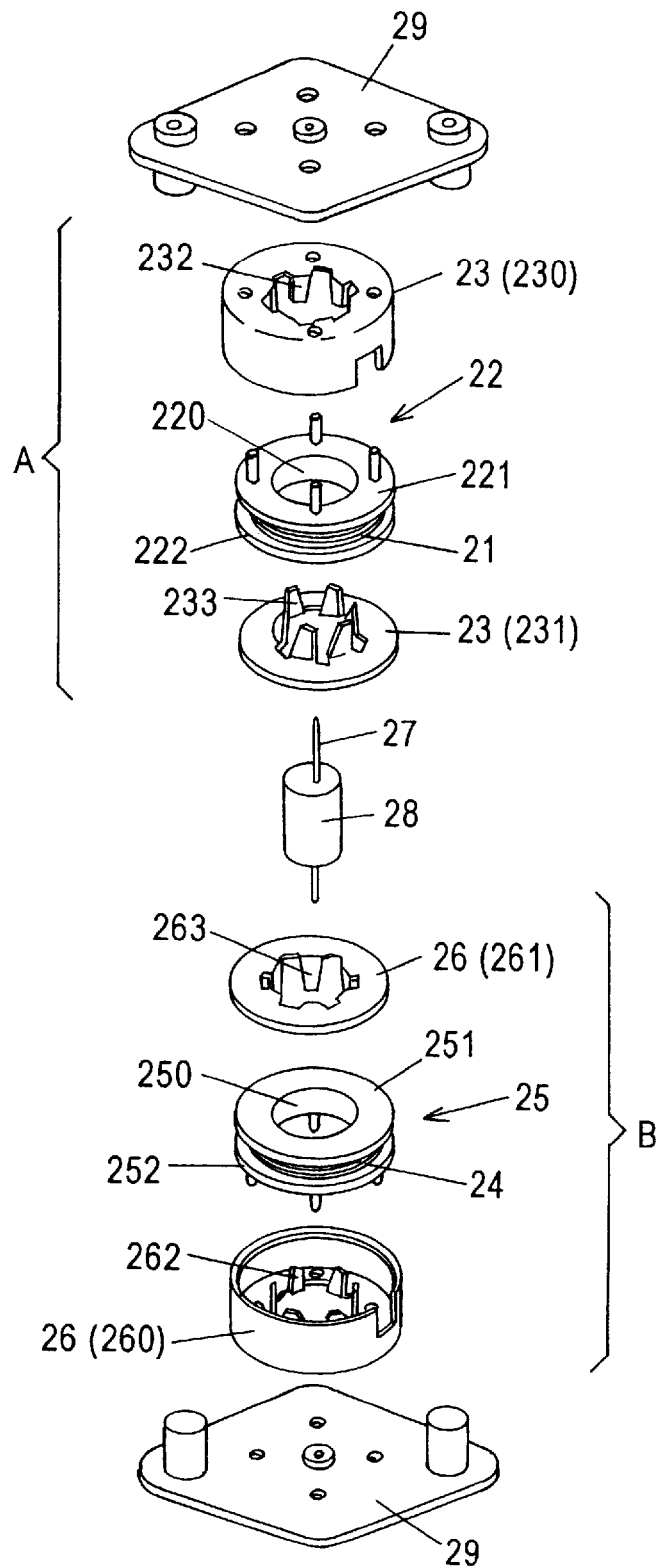
FIG. 2 is an exploded perspective view of a stepping motor shown in FIG. 1.
Figure 3:
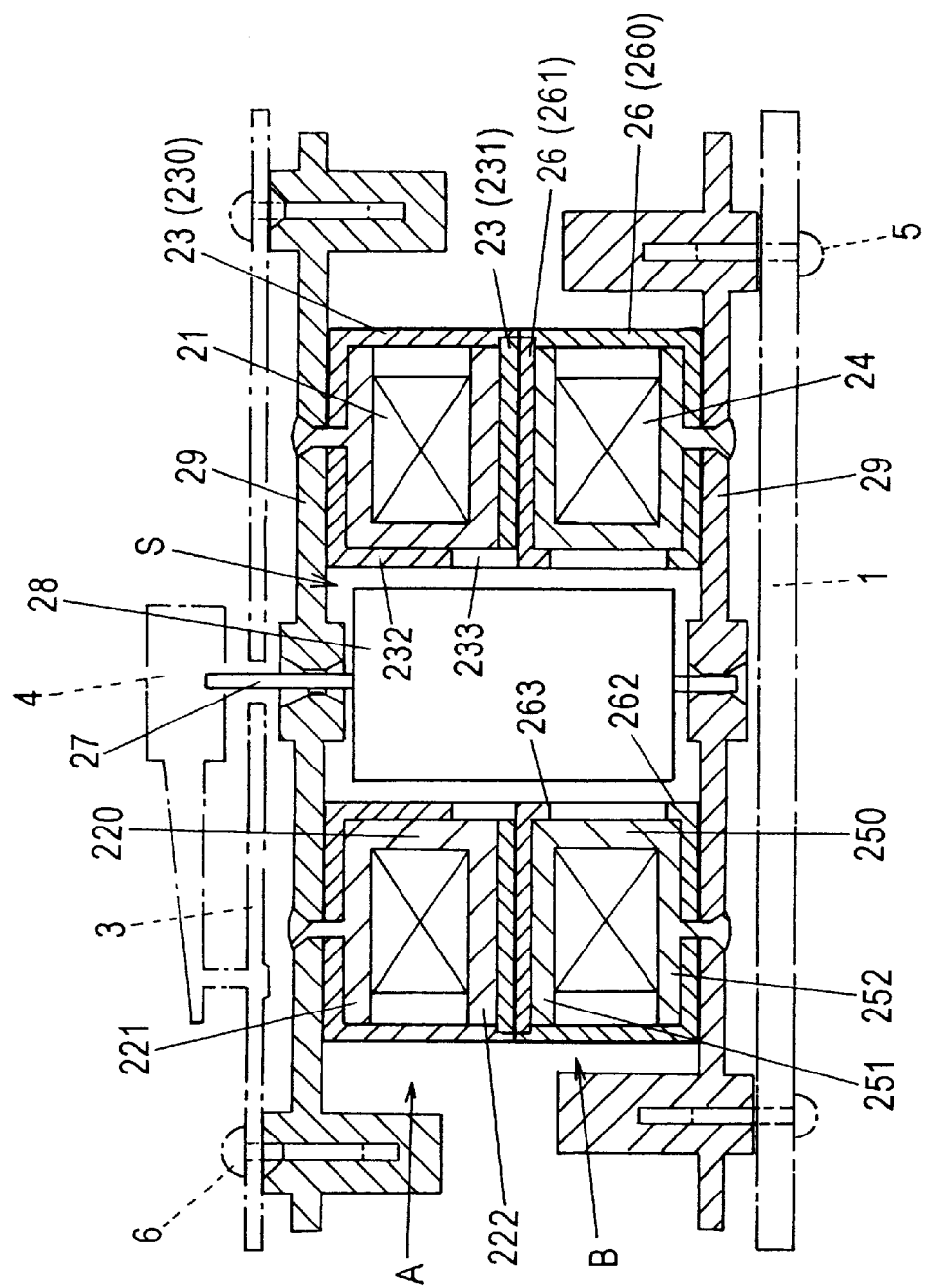
FIG. 3 is a cross-sectional view showing how the stepping motor of FIG. 2 is assembled.
Figure 4:
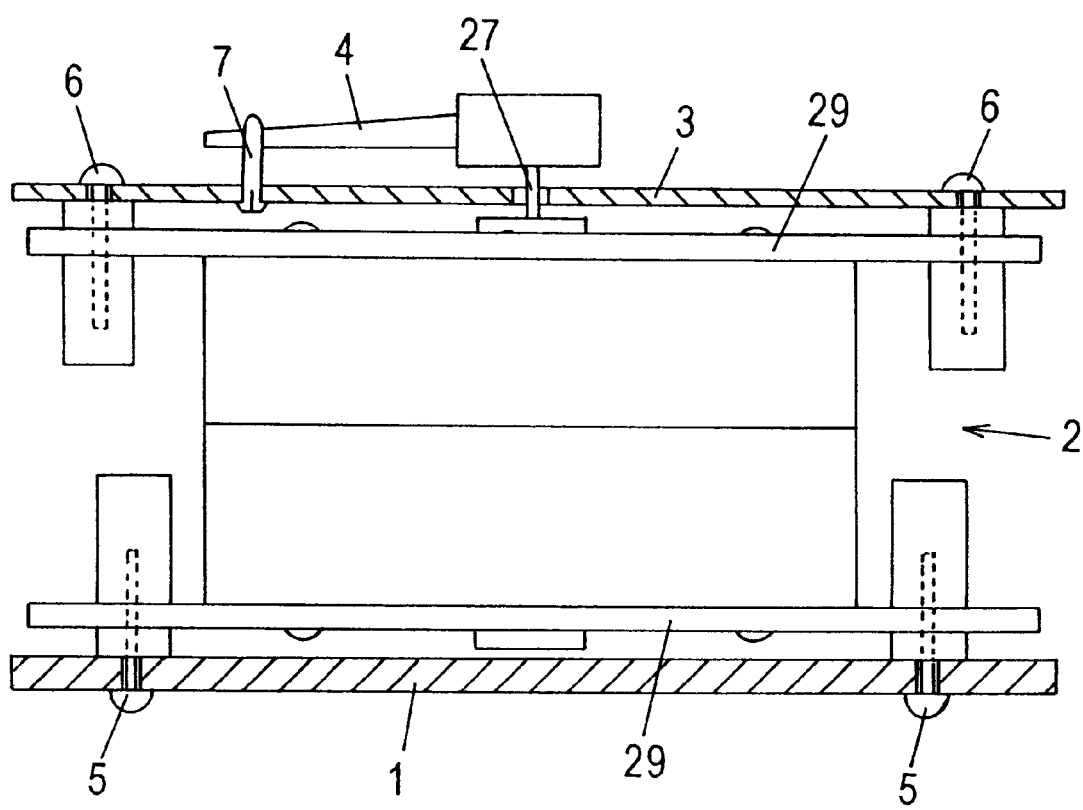
FIG. 4 is a cross-sectional view showing how the stepping motor type indicator of FIG. 1 is assembled.
Figure 5:
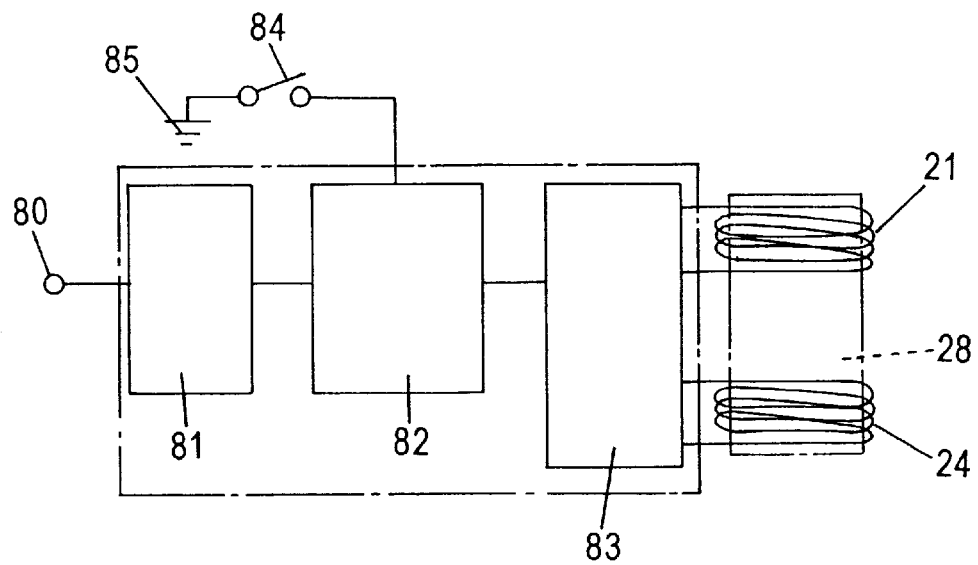
FIG. 5 is a block diagram showing a driving system of the stepping motor type indicator.
Figure 6:
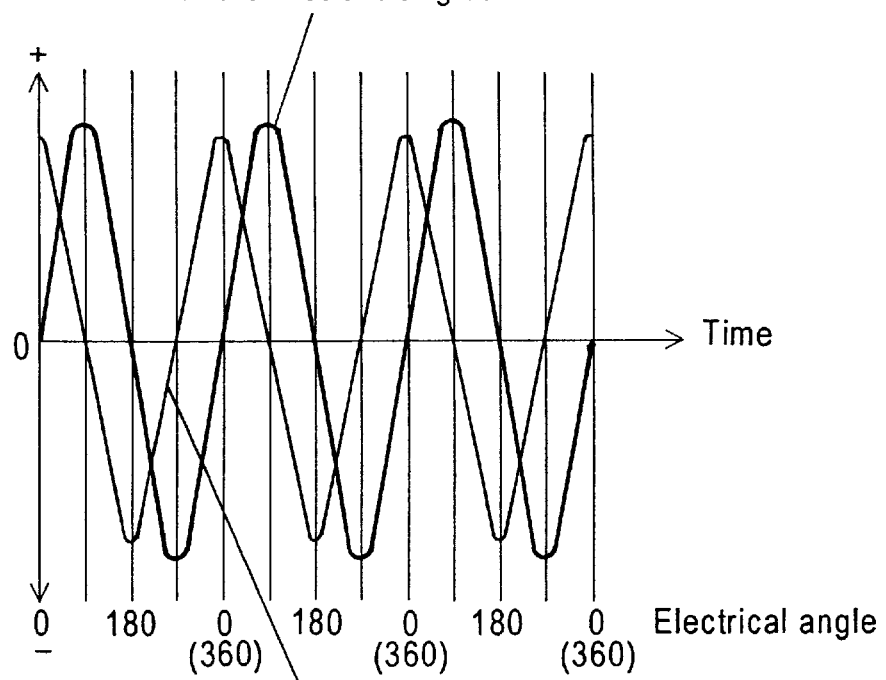
FIG. 6 is a waveform diagram showing output waveforms of driving means.
Figure 7A:
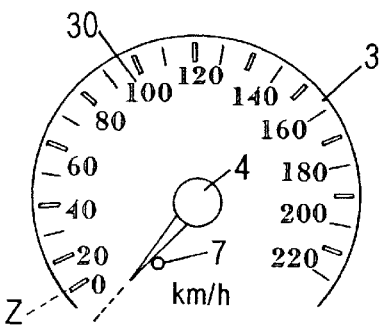
FIG. 7(a) to FIG. 7(c) are elevational views showing the operation of the stepping motor type indicator of the embodiment.
Figure 7B:
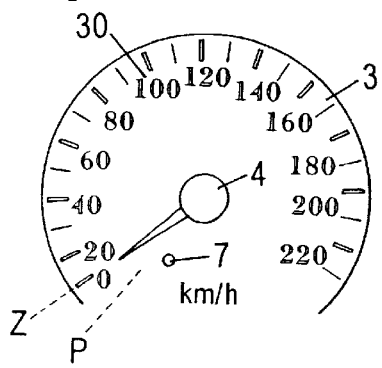
Figure 7C:
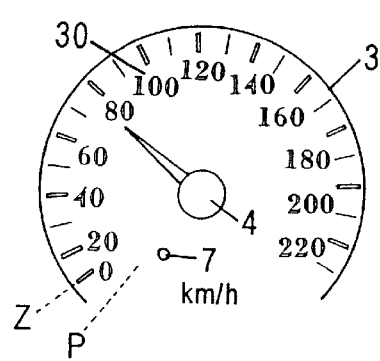
Figure 8:
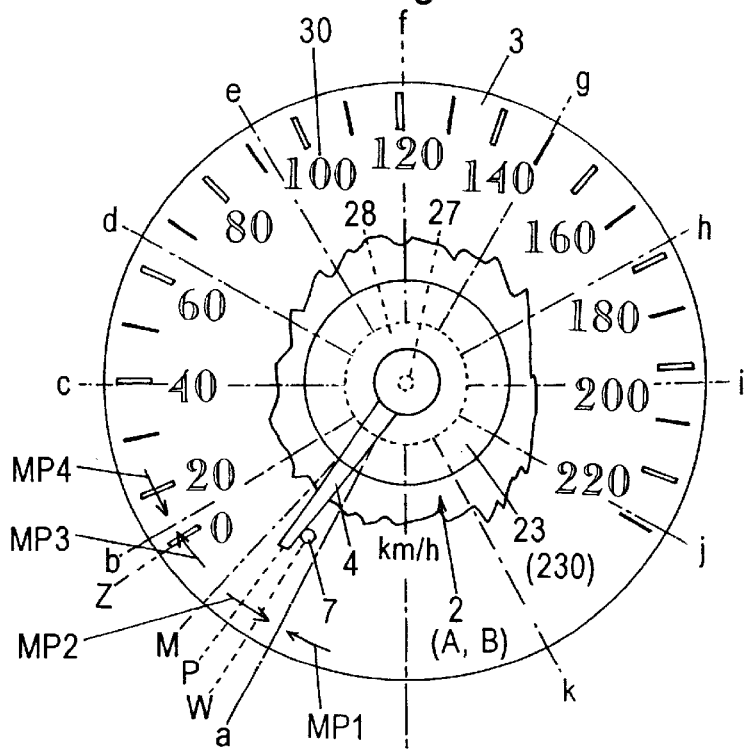
FIG. 8 is a partially cutaway elevational view showing a relationship between a stopping position of a pointer (rotor) determined by rotor arresting means and stable points.
Figure 9:
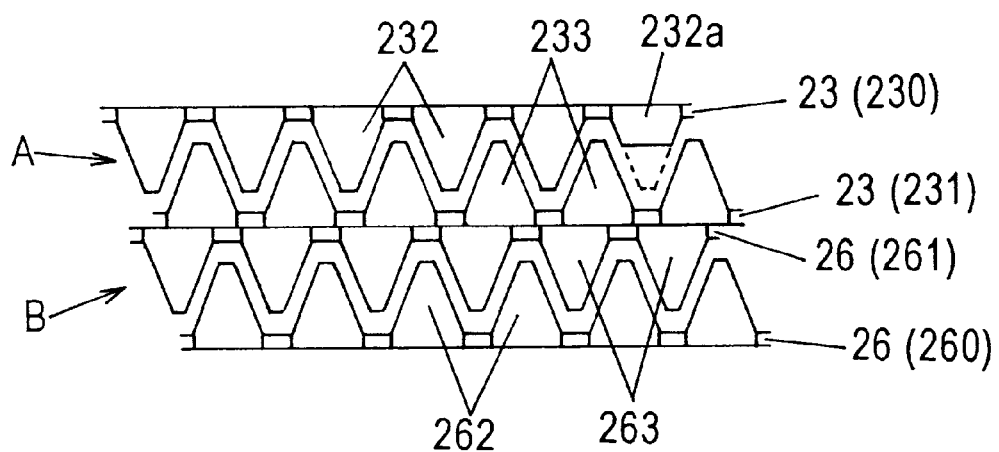
FIG. 9 is a development showing the arrangement of individual pole teeth.

FIG. 1 is an exploded perspective view of a stepping motor type indicator according to the preferred embodiment of the invention; FIG. 2 is an exploded perspective view of a stepping motor 2 shown in FIG. 1; FIG. 3 is a cross-sectional view showing how the stepping motor 2 of FIG. 2 is assembled; FIG. 4 is a cross-sectional view showing how the stepping motor type indicator of FIG. 1 is assembled; FIG. 5 is a block diagram showing a driving system of the stepping motor type indicator; FIG. 6 is a waveform diagram showing output waveforms of driving means; FIGS. 7(a)–7(c) are elevational views showing the operation of the stepping motor type indicator of the embodiment; FIG. 8 is a partially cutaway elevational view showing a positional relationship between the stepping motor 2 (rotor 28) and a dial plate 3 (rotor arresting means); and FIG. 9 is a development showing the arrangement of individual pole teeth.

In FIG. 1, the stepping motor type indicator constitutes a speedometer for indicating the running speed of a motor vehicle, for example. The stepping motor type indicator comprises the stepping motor 2 mounted on a support member 1, which is formed of a printed wiring board, for instance, the aforementioned dial plate 3 positioned in front of the stepping motor 2, the dial plate 3 bearing on its outer surface a scale 30 formed of graduation marks, numerals and other markings, and a pointer 4 which is driven by the stepping motor 2.

Referring to FIG. 2, the stepping motor 2 comprises a first stator A including a first exciting coil 21 wound around a first ring-shaped bobbin 22 made of a plastic material which is fitted in a first ring-shaped yoke 23 made of an iron-based metallic material, such as SEC, SPC or permalloy, a second stator B including a second exciting coil 24 wound around a second ring-shaped bobbin 25 made of a plastic material which is fitted in a second ring-shaped yoke 26 made of an iron-based metallic material, such as SEC, SPC or permalloy, a rotor 28 formed of permanent magnets having a plurality of magnetic poles which are arranged at regular intervals, an output shaft 27 being fixed on an central axis of the second stator B, and a pair of supporting plates 29 for supporting the output shaft 27 of the rotor 28.

In the first stator A, the first ring-shaped bobbin 22 is formed of a cylindrical winding section 220 and a pair of disk-like winding guides 221, 222 provided at both ends of the winding section 220.

The first ring-shaped yoke 23 is constructed of a generally cup-shaped first outer yoke element 230 and a generally sheet-like first inner yoke element 231 whose outside diameter is slightly larger than the inside diameter of an opening of the first outer yoke element 230. The first ring-shaped bobbin 22 is accommodated in the first outer yoke element 230 and held between the first outer yoke element 230 and the first inner yoke element 231.

In central parts of the first outer and inner yoke elements 230, 231, there are formed a plurality of pole teeth 232, 233 extending inward along a curved inner surface of the winding section 220 of the first ring-shaped bobbin 22. These pole teeth 232, 233 are formed into the generally same shape and arranged at generally equal intervals. The pole teeth 232, 233 of the first outer and inner yoke elements 230, 231 are meshed with one another like alternate comb teeth, together forming an annular array whose diameter is slightly larger than the outside diameter of the rotor 28.

In the second stator B, the second ring-shaped bobbin 25 is formed of a cylindrical winding section 250 and a pair of disk-like winding guides 251, 252 provided at both ends of the winding section 250.

Like the first ring-shaped yoke 23, the second ring-shaped yoke 26 is constructed of a generally cup-shaped second outer yoke element 260 and a generally sheet-like second inner yoke element 261 whose outside diameter is slightly larger than the inside diameter of an opening of the second outer yoke element 260. The second ring-shaped bobbin 25 is accommodated in the second outer yoke element 260 and held between the second outer yoke element 260 and the second inner yoke element 261.

In central parts of the second outer and inner yoke elements 260, 261, there are formed a plurality of pole teeth 262, 263 extending inward along a curved inner surface of the winding section 250 of the second ring-shaped bobbin 25. These pole teeth 262, 263 are formed into the generally same shape and arranged at generally equal intervals. The pole teeth 262, 263 of the second outer and inner yoke elements 260, 261 are meshed with one another like alternate comb teeth, together forming an annular array whose diameter is slightly larger than the outside diameter of the rotor 28.

The first stator A constructed of the first ring-shaped bobbin 22 and ring-shaped yoke 23 and the second stator B constructed of the second ring-shaped bobbin 25 and ring-shaped yoke 26 are concentrically stacked as shown in FIG. 3, wherein the openings of the individual outer yoke elements 230, 260 are connected by electric welding, forming a hollow space S inside, in which the rotor 28 is rotatably accommodated with both ends of the output shaft 27 supported by the supporting plates 29. The number of the pole teeth 232, 233 and of the pole teeth 262, 263 is made equal to the number of the magnetic poles of the rotor 28 and the pole teeth 262, 263 are offset from the pole teeth 232, 233 by as much as one-quarter of their tooth interval in the rotating direction of rotor 28. Further, the pole end areas of the pole teeth 232, 233, 262, 263 are made approximately equal to each other except the pole end area of the specified pole tooth 232a as will be described later.

Referring to FIGS. 1 and 4, the support member 1 and the dial plate 3 are fixed to the individual supporting plates 29 of the stepping motor 2 by tapping screws 5 and 6, respectively. On the other hand, the pointer 4 is firmly press-fitted to a far end of the output shaft 27 of the stepping motor 2 that extends passing through the dial plate 3. A stopper pin (rotor arresting means) 7 extending in the axial direction of the output shaft 27 is fixed on the outer surface of the dial plate 3. As will be described later, the stopper pin 7 serves to stop the pointer 4 at a specified position when the stepping motor type indicator is powered off as the pointer 4 comes into contact with the stopper pin 7 at power-off (non-excited condition). It is possible to employ a direct rotor stopper which comes into direct contact with rotor 28 to stop its motion or a direct shaft stopper (not shown) which comes into direct contact with a dedicated moving contact piece (not shown) attached to the output shaft 27 to stop its motion as rotor arresting means instead of the stopper pin.

The stepping motor type indicator thus constructed is driven by a driving system including the later-described driving means, in which driving signals according to a measurement value are supplied to the exciting coils 21, 24 and their magnetic paths are lead to the magnetic poles of the rotor 28 through the pole teeth 232, 233, 262, 263 of the individual ring-shaped yokes 23, 26, causing the rotor 28 to rotate in either direction as appropriate and the pointer 4 linked to the rotor 28 via the output shaft 27 to swing in accordingly. The pointer 4 which swings on the scale 30 marked on the dial plate 3 in this manner indicates the measurement value.

Operation of the stepping motor type indicator as it is used as a speedometer of a motor vehicle is described more specifically referring to FIG. 5. When a frequency signal which is proportional to the measurement value, or the running speed of the vehicle, is entered from an input terminal 80, a counter block 81 detects leading and trailing edges of the input signal, counts them throughout a specified gate time (gate time method) or counts a separate high-frequency clock signal by the input signal (period measurement method), and calculates the continuously varying running speed in the form of digital data.

The digital data which is the measurement value thus obtained is converted into indication angle data at specified conversion time intervals by a processing block 82, and the absolute value of the difference between the latest indication angle data and preceding indication angle data and increment/decrement status of the indication angle data are calculated at the conversion time intervals.

The latest indication angle data is used as the preceding indication angle data when the indication angle data is updated next. The latest and preceding indication angle data are repeatedly compared in this manner in each successive updating cycle.

The indication angle data thus updated is fed into an output block 83 which performs specific waveform processing (e.g., microstep operation and phase-converting operation) and supplied to the exciting coils 21, 24 of the stepping motor 2 as the driving signals (voltage signals). As a consequence, the exciting coils 21, 24 are excited and the magnetic paths are lead to the rotor 28 through the pole teeth 232, 233, 262, 263 of the individual ring-shaped yokes 23, 26 to drive the rotor 28, whereby the pointer 4 fixed to the output shaft 27 of the rotor 28 swings to an angular position corresponding to a correct speed readout on the scale 30 on the dial plate 3. In this embodiment, the counter block 81, the processing block 82 and the output block 83 together form driving means 800 for driving the stepping motor type indicator. In FIG. 5, the numeral 84 designates an ignition switch serving as a power switch and the numeral 85 designates an onboard battery serving as a power source.

The driving signals processed by the output block 83 are voltage signals shaped generally into sine and cosine waves having a phase difference of 90° in terms of electrical angle as shown in FIG. 6. These voltage signals are actually microstep waves which rise and fall in discrete small steps along the sine and cosine waves. As will be described later, the root-mean-square value of the driving signal fed into the first exciting coil 21 of the first stator A is made higher than the root-mean-square value of the driving signal fed into the exciting coil 24 of the second stator B in this embodiment. For example, the root-mean-square values of the driving signals fed into the first stator A and the second stator B are set to 7 V and 6.5 V, respectively.

The processing block 82 together with the counter block 81 may be formed of a microcomputer so that desired indicating characteristics can be programmed to allow the stepping motor type indicator to properly indicate the running speed. Power supply to the processing block 82 is obtained from the onboard battery 85 through the ignition switch 84.

Operation of the stepping motor type indicator of this embodiment is further described referring to FIGS. 5 and 7(a)–7(c). When the ignition switch 84 is off, the power is not supplied from the onboard battery 85 so that no driving signals are fed into the exciting coils 21, 24 (non-excited condition). In this embodiment, a stopping position P where the pointer 4 comes into contact with the stopper pin 7 and stays in the non-excited condition is slightly offset from a zero point Z of the scale 30 on the dial plate 3 to a decreasing side (negative side) of dial reading (FIG. 7(a)). When the ignition switch 84 is turned on and the power is fed from the onboard battery 85 to the driving means 800, the driving means 800 supplies the driving signals to the exciting coils 21, 24, whereby the pointer 4 is moved to the zero point Z (FIG. 7(b)). After the vehicle's engine has been started, the driving means 800 controls the driving signals according to the input signal from the input terminal 80 so that the pointer 4 gives an indication corresponding to the measurement value (FIG. 7(c)).

It is known that small magnetic forces (detent torques) are exerted on the rotor 28 even in the non-excited condition when the power is off not only in the stepping motor 2 used in the stepping motor type indicator but also in every PM-type stepping motor of this kind.

These magnetic forces (detent torques) are produced by magnetic circuits formed between the multiple magnetic poles of the rotor 28 and their corresponding pole teeth 232, 233, 262, 263 which have approximately the same pole end area and are arranged and meshed together at specified regular intervals. The magnetic forces (detent torques) produce a plurality of stable points which attract and hold the rotor 28 at specific positions. In most cases, the number of the stable points thus produced is approximately equal to the number of the magnetic poles of the rotor 28 or to a multiple (or the reciprocal of a multiple) of the number of the magnetic poles of the rotor 28. Since the rotor 28 having a total of 12 north and south poles are driven by a total of 24 pole teeth 232, 233, 262, 263 of both stators A, B in this embodiment, there are formed 6, 12 or 24 stable points.

The existence of these stable points is important for the relationship between the stepping motor 2 and the dial plate 3 especially in defining the stopping position P of the pointer 4 in the stepping motor type indicator which is constructed such that the pointer 4 is held stationary by the stopper pin 7 in the non-excited condition. The relationship between the stable points and the pointer 4 is defined as described below in this embodiment.

FIG. 8 shows a case in which there are formed 12 stable points a–l generally equal intervals. (The supporting plates 29 are not illustrated in FIG. 8.) Among these stable points a–l, arbitrarily selected first and second stable points a, b which are situated adjacent to each other along the increasing and decreasing directions of the pointer 4 are explained here. At the stable point a situated on the decreasing side of the indication of the pointer 4, a magnetic force which tends to hold the pointer 4 at the stable point a in a stable fashion is exerted on the rotor 28. In the vicinity of the stable point a, rotational magnetic forces MP1, MP2 which tend to attract the pointer 4 toward the stable point a are exerted on the rotor 28. Also at the stable point b situated on the increasing side of the pointer 4, a magnetic force which tends to hold the pointer 4 in a stable fashion at the stable point b is exerted on the rotor 28. In the vicinity of the stable point b, rotational magnetic forces MP3, MP4 which tend to attract the pointer 4 toward the stable point b are exerted on the rotor 28.

The rotational magnetic forces MP2, MP3 exerted on the rotor 28 to attract the pointer 4 between the stable points a, b lessen toward a middle point (unstable point) M between the stable points a, b and become most unstable at the middle point M. Thus, a stopping position W of the rotor 28 determined by the stopper pin 7 is provided between the first and second stable points a, b situated adjacent to each other along the increasing and decreasing directions of the pointer 4 which is fixed to the rotor 28, and at a point offset from the middle point M between the first and second stable points a, b toward the decreasing side of the indication of the pointer 4. In other words, the stopping position W of the rotor 28 is located at the point where the rotational magnetic force MP2, which tends to attract the pointer 4 toward the stable point a situated on the decreasing side of the indication of the pointer 4, is exerted on the rotor 28. With this arrangement, the pointer 4 situated at the stopping position P is biased toward the stopper pin 7 (or in a direction of contact with the stopper pin 7) by the rotational magnetic force MP2 and can be held at the point of origin P in a stable fashion. In this arrangement, it is desirable that the stopping position W of the rotor 28 be located neither at the middle point M nor at the stable point a, but it should be located at a point where the rotational magnetic force MP2 directed to the stable point a is sufficiently exerted on the rotor 28.

In certain cases, however, such a stable point which would bias or attract the rotor 28 in a specific direction is not formed unambiguously, and if a stable point created is ambiguous and its attracting force is too small, the stable point may not be able to positively hold the pointer 4 even when its stopping position P is determined in consideration of the stable point as described above.

Taking into account this potential problem, about half a terminal portion of one specific pole tooth 232a chosen from the multiple pole teeth 232, 233, 262, 263 is cut away in this invention as shown in FIG. 9. Accordingly, the pole end area of the pole tooth 232a facing the rotor 28 differs from the pole end areas of the other pole teeth 232, 233, 262, 263, and this serves to make the individual stable points a–l unambiguous so that they produce strong attracting forces. Although about half the terminal portion of one specific pole tooth 232a is cut away to differentiate its pole end area in the present embodiment, the pole end area of a particular pole tooth may be differentiated by forming the pole tooth in a smaller size from the beginning or by forming a hole in the pole tooth instead cutting it away.

In the earlier-described conventional construction in which the individual pole teeth 232, 233, 262, 263 have the same pole end area, it is unlikely that large differences occur in the detent torques produced by the magnetic circuits formed between individual the magnetic poles of the rotor 28 and their corresponding pole teeth 232, 233, 262, 263 and, therefore, the detent torques are generally balanced around the curved outer surface of the rotor 28 and the stable points tend to become ambiguous and produce small holding forces. If the pole end area of the specific pole tooth 232*a* facing the rotor 28 is made different from the pole end areas of the other pole teeth 232, 233, 262, 263, there is made a distinct difference between the detent torque produced by the pole tooth 232*a* and the detent torques produced by the other pole teeth 232, 233, 262, 263. Such variations in the detent torque create highly distinguishable relative differences between the stable points a–l (which exert larger attracting forces on the rotor 28) and unstable points M (which exert smaller attracting forces on the rotor 28) which are formed at specific intervals along the rotating direction of the rotor 28. For this reason, the stable points a–l become more distinct and, as a consequence, they gain the ability to securely bias or attract the rotor 28 toward its stopping position W to positively hold the pointer 4 at its stopping position P determined by the stopper pin 7.

In one aspect of the invention, the stepping motor type indicator of this embodiment so far described comprises the stepping motor 2 which is constructed of the rotor 28 having the output shaft 27 and the first and second stators A, B having the yokes 23, 26, from which the multiple pole teeth 232, 233, 262, 263 extend toward the curved outer surface of the rotor 28, and the exciting coils 21, 24 for magnetizing the yokes 23, 26, respectively, wherein the rotor 28 is driven to rotate in accordance with the measurement value, the pointer 4 which is connected to the output shaft 27 of the stepping motor 2 to indicate the measurement value on the dial plate 3, and the stopper pin (rotor arresting means) 7 for stopping the pointer 4 at the specified position on the dial plate 3. When the exciting coils 21, 24 are not excited, there are formed the multiple stable points a–l of the rotor 28 along the turning direction of the pointer 4 due to the magnetic forces exerted between the rotor 28 and the yokes 23, 26. The stopping position P of the rotor 28 (pointer 4) determined by the stopper pin 7 is set at a point closer to the stable point a which is located or the decreasing side of dial reading than the approximately middle point M between the arbitrarily selected two adjacent stable points a and b. Since the pole end area of the specific pole tooth 232*a* chosen from the multiple pole teeth 232, 233, 262, 263 facing the rotor 28 is made different from the pole end areas of the other pole teeth 232, 233, 262, 263 in this embodiment, the individual stable points a–l become unambiguous and produce strong holding forces so that the attracting force exerted by the stable point a on the pointer 4 (rotor 28) toward the stopper pin 7 is increased, making it possible to positively suppress undesirable movements of the pointer 4.

In another aspect of the invention, the stepping motor type indicator of this embodiment comprises the stepping motor 2 which is constructed of the rotor 28 having the output shaft 27 and the first and second stators A, B having the yokes 23, 26, from which the multiple pole teeth 232, 233, 262, 263 extend toward the curved outer surface of the rotor 28, and the exciting coils 21, 24 for magnetizing the yokes 23, 26, respectively, wherein the first and second stators A, B are concentrically stacked and the rotor 28 is driven to rotate in accordance with the measurement value, the driving means 800 which supplies the driving signals to the exciting coils 21, 24 of the individual stators A, B to cause the rotor 28 to rotate in accordance with the measurement value, the pointer 4 which is connected to the output shaft 27 to indicate the measurement value on the dial plate 3, and the stopper pin (rotor arresting means) 7 for stopping the pointer 4 at the specified position on the dial plate 3. When the exciting coils 21, 24 are not excited, there are formed the multiple stable points a–l of the rotor 28 along the turning direction of the pointer 4 due to the magnetic forces exerted between the rotor 28 and the yokes 23, 26. The stopping position P of the rotor 28 (pointer 4) determined by the stopper pin 7 is set at a point closer to the stable point a which is located on the decreasing side of dial reading than the approximately middle point M between the arbitrarily selected two adjacent stable points a and b. As the pole end area of the specific pole tooth 232*a* chosen from the multiple pole teeth 232, 233, 262, 263 facing the rotor 28 is made different from the pole end areas of the other pole teeth 232, 233, 262, 263 in this embodiment, there is created a relative difference between the pole end areas of the pole teeth 232 (232*a*), 233 of the first stator A facing the rotor 28 and those of the pole teeth 262, 263 of the second stator B. Since the root-mean-square value of the driving signal fed into the exciting coil 21 of the first stator A whose pole teeth 232 (232*a*), 233 have smaller pole end areas facing the rotor 28 is made higher than the root-mean-square value of the driving signal fed into the exciting coil 24 of the second stator B whose pole teeth 262, 263 have larger pole end areas facing the rotor 28, the individual stable points a–l become unambiguous and produce strong holding forces so that the attracting force exerted by the stable point a on the pointer 4 (rotor 28) toward the stopper pin 7 is increased, making it possible to positively suppress undesirable movements of the pointer 4. Furthermore, it becomes possible to maintain good excitation balance between the individual stators A, B in a normal driven condition (excited condition) and thereby suppress adverse effects on rotational characteristics of the rotor 28 during normal operation.

If the pole end area of the specific pole tooth 232*a* chosen from the multiple pole teeth 232, 233, 262, 263 facing the rotor 28 is made different from the pole end areas of the other pole teeth 232, 233, 262, 263, the attracting force exerted on the pointer 4 (rotor 28) by the stable point a toward the stopper pin 7 is increased and undesirable movements of the pointer 4 can be positively suppressed as described above. When the pole end area of the specific pole tooth 232*a* facing the rotor 28 is made different from the pole end areas of the other pole teeth 232, 233, 262, 263 and there is a relative difference between the pole end areas of the pole teeth 232 (232*a*), 233 of the first stator A facing the rotor 28 and those of the pole teeth 262, 263 of the second stator B, a difference in excitation torque could occur between the two stators A, B in the normal operating condition (excited condition), affecting rotational characteristics of the rotor 28 in certain cases. Thus, the root-mean-square value of the driving signal fed into the exciting coil 21 of the first stator A whose pole teeth 232 (232*a*), 233 have smaller pole end areas facing the rotor 28 is made higher than the root-mean-square value of the driving signal fed into the exciting coil 24 of the second stator B whose pole teeth 262, 263 have larger pole end areas facing the rotor 28 in order to increase the excitation torque produced by the first stator A relative to the excitation torque produced by the second stator B and thereby achieve a proper balance of excitation torque between the two stators A, B. This makes it possible to suppress such adverse effects on the rotational characteristics of the rotor 28 as an increase in the indication error of the pointer 4 and degradation of smoothness of the movement of the pointer 4 when there is a difference in the pole end areas of the pole teeth 232, 233, 262, 263 facing the rotor 28 between the two stators A, B.

Although the pole end area of the specific pole tooth 232*a* is made smaller in this embodiment, the pole end area of the specific pole tooth 232a may be made larger than the pole end areas of the other pole teeth 232, 233, 262, 263.

Furthermore, although the pole end area of only one specific pole tooth 232a is differentiated in this embodiment, the pole end area of more than one specific pole tooth 232a may be made different from the pole end areas of the other pole teeth 232, 233, 262, 263.

An advantage gained by differentiating the pole end area of only one specific pole tooth 232a is that it is possible to reduce such adverse effects on the rotational characteristics of the rotor 28 in the normal operating condition (excited condition) as an increase in the indication error of the pointer 4 and degradation of smoothness of the movement of the pointer 4.

More specifically, although the rotational characteristics of the rotor 28 in the normal operating condition (excited condition) would be adversely affected if the pole end areas of some of the pole teeth 232, 233, 262, 263 are differentiated from the pole end areas of the other pole teeth 232, 233, 262, 263, it is possible to minimize such adverse effects on the rotational characteristics of the rotor 28 during operation in the excited condition when the pole end area of only one pole tooth 232a is made different from the pole end areas of the other pole teeth 232, 233, 262, 263.

Figure 10A:
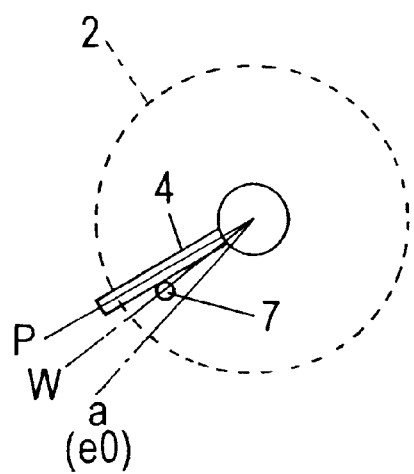
FIG. 10(a) is a fragmentary elevational view showing a relationship between a stable point and an angular position taken by the pointer when driving signals having a phase difference of 0° in terms of electrical angle is entered.
Figure 10B:
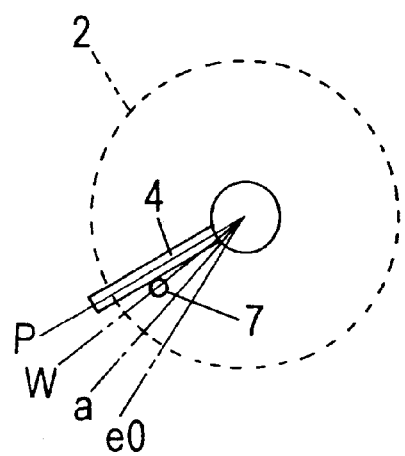
FIG. 10(b) is a fragmentary elevational view showing a comparative example of FIG. 10(a).

In this embodiment, an angular position e0 taken by the pointer 4 when the driving means 800 outputs driving signals (see FIG. 6) corresponding to an electrical angle of 0° is matched with the stable point a produced in the non-excited condition as shown in FIG. 10(*a*).

This is because the driving means 800 outputs the driving signals corresponding to the electrical angle of 0° when the ignition switch 84 is turned on.

When the ignition switch 84 is off, the rotor 28 (pointer 4) is prohibited from rotating by the stopper pin 7 and remains stationary at the stopping position P due to the attracting force exerted by the stable point a. When the ignition switch 84 is turned on, the driving means 800 supplies the driving signals corresponding to the electrical angle of 0° into the exciting coils 21, 24. While a turning force which causes the pointer 4 to swing toward the angular position e0 corresponding to the electrical angle of 0° is exerted on the rotor 28 (pointer 4) at this point, the movement of the pointer 4 is stopped by the stopper pin 7. At this time, the turning force which could turn the pointer 4 from its stopping position P determined by the stopper pin 7 to the angular position e0 is exerted on the rotor 28 (pointer 4).

If, however, the stable point a and the angular position e0 taken by the pointer 4 when the driving means 800 outputs the driving signals corresponding to the electrical angle of 0° are situated apart from each other as shown in FIG. 10(*b*), an excessive torque (turning force) corresponding to the distance between the stable point a and the angular position e0 is applied to the stopper pin 7. In this case, the pointer 4 is likely to jump over the stopper pin 7 depending on the materials of the pointer 4 and the stopper pin 7 themselves. In this circumstance, if the stable point a and the angular position e0 taken by the pointer 4 when the driving means 800 outputs the driving signals corresponding to the electrical angle of 0° are matched with each other as shown in FIG. 10(*a*), the torque (turning force) applied to the stopper pin 7 decreases as a result of the reduction in the distance between the stable point a and the angular position e0, making it possible to prevent the jumping of the pointer 4. Although the stable point a and the angular position e0 taken by the pointer 4 when the driving means 800 outputs the driving signals corresponding to the electrical angle of 0° are matched with each other in this embodiment, they need not necessarily coincide exactly with each other but should just be situated as close to each other as would be sufficient to prevent the jumping of the pointer 4.

In a case where the driving means 800 for driving the stepping motor 2 supplies the driving signals whose output waveforms have a phase difference of about 90° in terms of electrical angle, it is possible to prevent the pointer 4 from moving from its stopping position P determined by the stopper pin 7 when the driving means 800 outputs the driving signals corresponding to the electrical angle of 0° (when the ignition switch 84 is turned on) as described above, if the angular position e0 taken by the pointer 4 when the driving means 800 outputs the driving signals corresponding to the electrical angle of 0° and the stable point a produced in the non-excited condition are matched exactly or approximately with each other.

As described above in detail, a stepping motor type indicator in one aspect of the invention comprises a stepping motor which is constructed of a rotor formed of permanent magnets and having an output shaft, and a stator having a yoke, from which a plurality of pole teeth extend toward a curved outer surface of the rotor, and an exciting coil for magnetizing the yoke, in which the rotor is driven to rotate in accordance with a measurement value, a pointer which is connected to the output shaft of said stepping motor and indicates the measurement value on a dial plate, and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yoke in a non-excited condition of the exciting coil, and the pole end area of a specific pole tooth chosen from said multiple pole teeth facing the rotor is made different from the pole end areas of the other pole teeth facing the rotor. According to this construction, it is possible to provide a stepping motor type indicator in which individual stable points produced in the non-excited condition are made unambiguous and undesirable movements of the pointer can be suppressed.

In another aspect of the invention, a stepping motor type indicator comprises a stepping motor which is constructed of a rotor formed of permanent magnets and having an output shaft, and first and second stators individually having yokes, from which a plurality of pole teeth extend toward a curved outer surface of the rotor, and exciting coils for magnetizing the yokes, in which said first and second stators are concentrically stacked and said rotor is driven to rotate in accordance with a measurement value, a driver which supplies driving signals to the exciting coils of said individual stators to cause the rotor to rotate in accordance with the measurement value, a pointer which is connected to the output shaft of said stepping motor and indicates the measurement value on a dial plate, and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yokes in a non-excited condition of the exciting coils, the pole end area of a specific pole tooth chosen from said multiple pole teeth facing the rotor is made different from the pole end areas of the other pole teeth facing the rotor so that a relative difference is created between the pole end areas of the pole teeth of said first stator facing the rotor and those of the pole teeth of said second stator, and the root-mean-square value of the driving signal fed into the exciting coil of said first stator whose pole teeth have smaller pole end areas facing the rotor is made higher than the root-mean-square value of the driving signal fed into the exciting coil of said second stator whose pole teeth have larger pole end areas facing the rotor. According to this construction, it is possible to provide a stepping motor type indicator in which individual stable points produced in the non-excited condition are made unambiguous and undesirable movements of the pointer can be suppressed. Furthermore, it becomes possible to maintain good excitation balance between the two stators in a normal driven condition (excited condition) and thereby suppress adverse effects on rotational characteristics of the rotor during normal operation.

In one specific form of the invention, the pole end area of only one specific pole tooth is made different from the pole end areas of the other pole teeth. This makes it possible to reduce adverse effects on the rotational characteristics of the rotor in the normal operating condition (excited condition).

In a further aspect of the invention, a stepping motor type indicator comprises a stepping motor which is constructed of a rotor formed of permanent magnets and having an output shaft, and first and second stators individually having yokes, from which a plurality of pole teeth extend toward a curved outer surface of the rotor, and exciting coils for magnetizing the yokes, in which said first and second stators are concentrically stacked and said rotor is driven to rotate in accordance with a measurement value, a driver which supplies driving signals whose output waveforms have a phase difference of about 90° in terms of electrical angle to the exciting coils of said individual stators to cause the rotor to rotate in accordance with the measurement value, a pointer which is connected to the output shaft of said stepping motor and indicates the measurement value on a dial plate, and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yokes in a non-excited condition of the exciting coils, the pole end area of a specific pole tooth chosen from said multiple pole teeth facing the rotor is made different from the pole end areas of the other pole teeth facing the rotor, and an angular position taken by the said pointer when said driver outputs the driving signals corresponding to an electrical angle of 0° and said stable point in the non-excited condition are matched exactly or approximately with each other. According to this construction, it is possible to provide a stepping motor type indicator in which individual stable points produced in the non-excited condition are made unambiguous and undesirable movements of the pointer can be suppressed. Furthermore, it becomes possible to prevent the pointer from deviating from its stopping position when the stepping motor type indicator is powered on.

What is claimed:

1. A stepping motor type indicator comprising a stepping motor which is constructed of a rotor formed of permanent magnets and having an output shaft, and first and second stators individually having yokes, from which a plurality of pole teeth extend toward a curved outer surface of the rotor, and exciting coils for magnetizing the yokes, in which said first and second stators are concentrically stacked and said rotor is driven to rotate in accordance with a measurement value; a driver which supplies driving signals to the exciting coils of said individual stators to cause the rotor to rotate in accordance with the measurement value; a pointer which is connected to the output shaft of said stepping motor and indicates the measurement value on a dial plate; and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yokes in a non-excited condition of the exciting coils, the pole end area of a specific pole tooth chosen from said multiple pole teeth facing the rotor is made different from the pole end areas of the other pole teeth facing the rotor so that a relative difference is created between the pole end areas of the pole teeth of said first stator facing the rotor and those of the pole teeth of said second stator, and the root-mean-square value of the driving signal fed into the exciting coil of said first stator whose pole teeth have smaller pole end areas facing the rotor is made higher than the root-mean-square value of the driving signal fed into the exciting coil of said second stator whole pole teeth have larger pole end areas facing the rotor.

2. A stepping motor type indicator according to claim 1, wherein the pole end area of only one specific pole tooth is made different from the pole end areas of the other pole teeth.

3. A stepping motor type indicator according to claim 2, wherein an angular position taken by said pointer when said driver outputs the driving signals corresponding to an electrical angle of 0° and said stable point in the non-excited condition are matched exactly or approximately with each other.

4. A stepping motor type indicator according to claim 1, wherein an angular position taken by said pointer when said driver outputs the driving signals corresponding to an electrical angle of 0° and said stable point in the non-excited condition are matched exactly or approximately with each other.

5. A stepping motor type indicator comprising a stepping motor which is constructed of a rotor formed of permanent magnets and having an output shaft, and first and second stators individually having yokes, from which a plurality of pole teeth extend toward a curved outer surface of the rotor, and exciting coils for magnetizing the yokes, in which said first and second stators are concentrically stacked and said rotor is driven to rotate in accordance with a measurement value; a driver which supplies driving signals whose output waveforms have a phase difference to the exciting coils of said individual stators to cause the rotor to rotate in accordance with the measurement value; a pointer which is connected to the output shaft of said stepping motor and indicates the measurement value on a dial plate; and a rotor stopper for stopping said pointer at a specified stopping position on the dial plate, wherein the stopping position of said pointer determined by said rotor stopper is set at a point closer to a stable point which is located on a decreasing side of dial reading of said pointer than an approximately middle point between two adjacent stable points arbitrarily selected from a plurality of stable points of the rotor which are formed along the turning direction of said pointer due to magnetic forces exerted between the rotor and the yokes in a non-excited condition of the exciting coils, the pole end area of a specific pole tooth chosen from said multiple pole teeth facing the rotor is made different from the pole end areas of the other pole teeth facing the rotor to increase an attractive force at the stable points, and an angular position taken by the said pointer when said driver outputs the driving signals corresponding to an electrical angle of 0° and said stable point in the non-excited condition are matched exactly or approximately with each other.

* * * * *